United States Patent
Takano et al.

(10) Patent No.: US 6,309,789 B1
(45) Date of Patent: Oct. 30, 2001

(54) COMPOSITION FOR REFLECTION REDUCING COATING

(75) Inventors: Yusuke Takano; Hatsuyuki Tanaka, both of Shizuoka; Kiyofumi Takano; Yutaka Hashimoto, both of Osaka, all of (JP)

(73) Assignees: Clariant Finance (BVI) Limited, Tortola (VG); Dainippon Ink and Chemicals, Inc., Tokyo (JP)

( * ) Notice: Subject to any disclaimer, the term of this patent is extended or adjusted under 35 U.S.C. 154(b) by 0 days.

(21) Appl. No.: 09/485,087

(22) PCT Filed: May 27, 1999

(86) PCT No.: PCT/JP99/02803

§ 371 Date: May 25, 2000

§ 102(e) Date: May 25, 2000

(87) PCT Pub. No.: WO99/63010

PCT Pub. Date: Dec. 9, 1999

(30) Foreign Application Priority Data

Jun. 3, 1998 (JP) .................................................. 10-154344

(51) Int. Cl.$^7$ ........................................................ G03F 7/004
(52) U.S. Cl. ........................................ 430/270.1; 430/273.1; 430/325
(58) Field of Search .............................. 430/270.1, 273.1, 430/325

(56) References Cited

U.S. PATENT DOCUMENTS 5,514,526  5/1996  Nishi et al. ........................... 430/325
5,744,537  4/1998  Brunsvold et al. ................... 524/520
5,853,471 * 12/1998  Yoshida et al. ................... 106/287.13

FOREIGN PATENT DOCUMENTS 0 522 990   1/1963  (EP) .
0 803 776  10/1997  (EP) .

OTHER PUBLICATIONS

Abstract for Japan Patent No. 6118630.

Abstract for Japan Patent No. 6148896.

Abstract for Japan Patent No. 10003001.

* cited by examiner

Primary Examiner—Janet Baxter
Assistant Examiner—Rosemary Ashton
(74) Attorney, Agent, or Firm—Sangya Jain

(57) ABSTRACT

The anti-reflective coating composition comprising at least perfluoroalkylsulfonic acid (A) represented by the general formula: $C_nF_{2n+1}SO_3H$ (n is an integer of 4 to 8), organic amine (B), water-soluble polymer (C), perfluoroalkyl sulfonamide (D) represented by the general formula: $C_nF_{2n+1}SO_2NH_2$ (n is an integer of 1 to 8) and water (E) and having a pH value of 1.3 to 3.3 is applied onto a photoresist film formed on a substrate, thus forming an anti-reflective coating. The photoresist and anti-reflective coating are then exposed to light and developed to give a resist pattern. The coating composition can form a uniform anti-reflective coating free of standing wave, multiple reflection, T-top and PED (Post Exposure Delay) in a small amount of drip onto any types of resists regardless of the surface shape of a substrate.

5 Claims, No Drawings

COMPOSITION FOR REFLECTION REDUCING COATING

TECHNICAL FIELD

The present invention relates to an anti-reflective coating composition and in particular to an anti-reflective coating composition for preventing a reduction in pattern dimensional accuracy (change in pattern dimensional width) caused by interference, in a photoresist film, of incident light and reflected light off a photoresist surface, with reflected light off a substrate surface, upon photolithographically forming a pattern on a photoresist film; and a method for forming a pattern by use of said anti-reflective composition.

BACKGROUND ART

In the production of semiconductor elements, lithographic technique is applied in which a photoresist film is formed on a substrate such as silicon wafer, then exposed selectively with actinic radiation and developed whereby a resist pattern is formed on the substrate.

In recent years, pattern technology to form finer pattern by lithographic process has made a rapid progress in order to attain a higher degrees of integration in LSI. In forming finer patterns, various proposals have been made for exposure apparatuses, photoresists, anti-reflective coatings etc. in a wide variety of processes. For exposure apparatuses, processes using a shorter-wavelength light source effective for highly fine patterns, that is, processes using deep-ultraviolet rays such as KrF excimer laser (248 nm), ArF excimer laser (193 nm) etc., X-rays or electron beams have been proposed and some come to serve for practical use. In the lithographic process of using such short-wavelength light sources, highly sensitive chemically amplified resists corresponding to short-wavelength energy rays are proposed (Japanese Patent Application Laid-open Specification Nos. 209977/90, 19847/90, 206458/91, 211258/92, and 249682/93).

The process of using such a short-wavelength light source and chemically amplified resists is sensitively affected by acidic substances, basic substances and water present in an atmosphere. Therefore, there is the problem that if resists are allowed to stand for a long time after exposure until post exposure bake (PEB), pattern profiles after development become T-shaped (T top) in case of positive resists or post exposure delay (PED) takes place where the dimension of resist patterns varies depending on the length of time during the resists were left.

Further, if a short-wavelength and single-wavelength light source is used, incident light generally interferes with reflected light in the photoresist/substrate and photoresist/air interfaces, resulting in another problem (standing wave effect, multiple reflection effect) that the substantial magnitude of light exposure in the layer is altered to adversely affect resist patterns.

A method of forming an anti-reflective coating on a photoresist film (ARCOR method) has been proposed as one method for solving such PED and/or standing wave effect. Conventionally, a composition soluble in an organic solvent such as halogen-based solvent etc. has been proposed as a material for forming an anti-reflective coating in the ARCOR method. Recently a large number of processingly advantageous compositions soluble in resist developer solutions (aqueous alkaline solutions) have been proposed. However, compositions proposed heretofore are not adequate in the effect of solving the PED and/or standing wave effect, or even if these problems are solved, another new problem will occur.

For example, Japanese Patent Application Laid-open Specification No.188598/93 discloses a composition developable with aqueous developer, comprising a fluorocarbon compound, a water-soluble polymer binder and an amine. However if an anti-reflective coating made 6f this composition is formed on a resist film, an residue undeveloped (insolubilized layer) may be generated on the upper layer of the resulting resist pattern after development. This phenomenon occurs presumably because the surface of the resist film is made insoluble in a developer by the interaction between components in the anti-reflective coating and resist components such as novolak resin and naphthoquinone diazide in the presence of a quaternary ammonium salt in the developer. Further, the refractive index of the anti-reflective coating consisting of this composition developable with aqueous developer, comprising a fluorocarbon compound, a water-soluble polymer binder and an amine is far from an ideal refractive index.

Japanese Patent Application Laid-open Specification No.51523/94 discloses a composition comprising various water-soluble fluorine-containing compounds such as N-propyl-N-(2-hydroxyethyl) perfluorooctane sulfonamide etc. having a water solubility of 1% by weight or more, but the dimension stability of this composition when using short-wavelength light sources is hardly compatible with coating suitability for various resist materials and various stepped substrates.

Japanese Patent Application Laid-open Specification No. 118630/94 proposes a coating composition for chemically amplified resists, comprising a water-soluble film-forming component and a proton generating substance. The problem of this coating composition is that the problem of PED cannot be solved because its high refractive index makes the reflection preventing effect inadequate and a weak acid salt of ammonium exemplified as the proton generating substance inactivates an acid generated from the chemically amplified resist and present in the surface of the resist.

Japanese Patent Application Laid-open Specification No. 148896/94 discloses a composition comprising a water-soluble film-forming component and a fluorine-containing surface active agent, where a poly(vinyl pyrrolidone) homopolymer is mentioned as a preferable example of the water-soluble film-forming component and a fluorine-containing organic amnonium salt as a preferable example of the fluorine-containing surface active agent. Japanese Patent Application Laid-open Specification No.292562/96 discloses a composition containing a poly(vinyl pyrrolidone)-based resin, a fluorine-containing surface active agent, and a water-soluble fluorine compound of fluorinated aliphatic carboxylic acid amide such as 2-chloro-2,2-difluoroacetamide etc. However these compositions are poor in coating suitability for various resist materials and various substrates Ad- such as stepped substrates, so there are problems that resist materials to be applied or substrates as the object of coating are limited or a large amount of anti-reflective coating composition is required in applying the substrate. Further, these compositions cannot solve the problem of PED in the chemically amplified resist.

The present inventors previously found that an anti-reflective coating composition having low refractive index and being excellent in coating stability can be obtained by use of a composition comprising perfluoroalkylsulfonic acid, monoethanolamine, poly(vinyl pyrrolidone), a water-soluble alkyl siloxane polymer and water (Japanese Patent Application Laid-open Specification No. 291228/97), or by use of a combination of two or more fluorine compounds different in the length of the alkyl chain and a perfluoroalkyl group-containing sulfonyl amide compound (Japanese Patent Application Laid-open Specification No. 3001/98). However these compositions had the problem that coating defects in a streak form occur on stepped substrates such as logic IC etc.

Accordingly, the object of the present invention is to provide an anti-reflective coating composition free of the above problems and a method of forming a pattern by use thereof, that is, to provide an anti-reflective coating composition and a method of forming a pattern by use thereof where the composition is capable of solving the PED, standing wave effect and multiple reflection effect and has excellent suitability for applying on various resist materials and various substrates, specifically being applicable in a small amount of drip and having no coating defects even on stepped substrates.

DISCLOSURE OF THE INVENTION

As a result of their eager study to solve the above problems, the inventors found that the problems are solved by use of an anti-reflective coating composition comprising at least the following (A), (B), (C), (D) and (E) and having a pH value of 1.3 to 3.3, and the present invention was thereby completed.

That is, the first invention is to provide an anti-reflective coating composition comprising at least the following (A), (B), (C), (D) and (E) and having a pH value of 1.3 to 3.3, (A) perfluoroalkylsulfonic acid represented by the general formula:

$$C_nF_{2n+1}SO_3H \quad (I)$$

wherein n is an integer of 4 to 8, (B) organic amine, (C) water-soluble polymer, (D) perfluoroalkyl sulfonamide represented by the general formula:

$$C_nF_{2n+1}SO_2NH_2 \quad (II)$$

wherein n is an integer of 1 to 8, and (E) water.

The second invention is to provide an anti-reflective coating composition described in the first invention wherein the organic amine is monoethanolamine.

The third invention is to provide an anti-reflective coating composition described in the first or second invention wherein the water-soluble polymer is poly(vinyl pyrrolidone) and/or poly(acrylic acid).

The fourth invention is to provide an anti-reflective coating composition described in any one of the first, second and third inventions wherein the ratio by weight of perfluoroalkylsulfonic acid (A), organic amine (B), water-soluble polymer (C), and perfluoroalkyl sulfonamide (D) in the composition is set such that (A)/(B)/(D)=2.0 to 7.0/0.1 to 1.0/0.01 to 2.0 assuming that the ratio of water-soluble polymer (C) is 1.

The fifth invention is to provide a method of forming patterns which comprises the step of applying a composition described in any one of the first invention to fourth invention onto a photoresist film and heating it as necessary.

A general method of forming a resist pattern by the ARCOR method comprises e.g. the step of applying a photoresist composition onto a semiconductor substrate, the step of baking the formed photoresist film as necessary, the step of applying an anti-reflective coating composition on said photoresist film as necessary, the step of post exposure bake said photoresist film and said anti-reflective coating film as necessary, the step of exposing said photoresist and anti-reflective coating layer through a mask in a predetermined pattern, the step of post exposure bake (PEB) as necessary, and the step of developing said photoresist and anti-reflective coating film with an aqueous alkaline solution.

First, the perfluoroalkylsulfonic acid used as component (A) in the anti-reflective coating composition of the present invention is used as a component for reducing the refractive index of the anti-reflective coating.

In order to achieve excellent anti-reflective properties generally by the ARCOR method, it is considered necessary to satisfy conditions such as in the following formulae 1 and 2:

$$n_{tarc} = \sqrt{n_{resist}} \quad \text{Formula 1}$$

wherein $n_{tarc}$ is the refractive index of an anti-reflective coating, and $n_{resist}$ is the refractive index of a resist.

$$d_{tarc} = x \cdot \lambda / 4 n_{tarc} \quad \text{Formula 2}$$

wherein $d_{tarc}$ is the thickness of an anti-reflective coating, $\lambda$ is the wavelength of an energy ray, and x is an odd integer.

As is evident from these formulae, anti-reflective ability is determined by the refractive indexes of an anti-reflective coating and a resist at the wavelength of an objective light source and by the thickness of the anti-reflective coating. The refractive index of the anti-reflective coating should be lower than that of the resist within the range in which the above conditions are satisfied.

It is known that the fluorine atom-containing compound indicates a low refractive index resulting from the characteristics of the large molecular volume and small refractive index of fluorine atom, and the value of its refractive index is almost proportional to the content of fluorine in the compound. The compound represented by the general formula $C_nF_{2n+1}SO_3H$ above is one effective as a fluorine-containing compound having low refractive index and developable with aqueous developer, which is a compound preferable for demonstrating anti-reflective performance. If the perfluoroalkylsulfonic acid represented by the general formula $C_nF_{2n+1}SO_3H$ above is absent, the resulting coating has an increased refractive index and fails to i sufficiently inhibit the standing wave effect and multiple reflection effect, resulting a reduction in the dimensional accuracy of the resist.

According to the findings of the present inventors, the perfluoroalkylsulfonic acid ($C_nF_{2n+1}SO_3H$) brings about different stability with time for the coating, depending on the chain length of the perfluoroalkyl ($C_nF_{2n+1}=R_f$) group in the molecule. If a long-chain $R_f$ group is used as $R_f$ group to increase the content of fluorine in the molecule of perfluoroalkylsulfonic acid, crystallization of $R_f$ group proceeds with time, thus causing the fatal problem of generation of turbidity and cracking in the coating. On the other hand, if a short-chain $R_f$ group is used, the refractive index of the resulting coating is increased, and the objective anti-reflective performance cannot be obtained. From this viewpoint, it is necessary to use the compound wherein n in $C_nF_{2n+1}SO_3H$ is 4 to 8 as the chain length of the $R_f$ group. Preferably, the compound with n=7 and/or 8 and at least one compound selected from those having n=4 to 6 are used simultaneously, and more preferably the compound with n=7 and/or 8, the compound with n=6, and the compound with n=4 and/or 5 are used simultaneously. The $R_f$ group may be straight-chain or branched. When compounds having different $R_f$ chain lengths are used simultaneously, their mixing ratio though being different depending on the objective anti-reflective performance, the resist materials used, the wavelength of the light source etc., is generally as follows: (compound with n=7 and/or 8)/(at least one compound selected from those with n=4 to 6)=99/1 to 1/99, preferably 80/20 to 20/80, and (compound with n=7 and/or 8)/(compound with n=6)/(compound with n=4 and/or 5)=10 to 95/4 to 80/1 to 70, preferably 20 to 80/20 to 60/5 to 50, more preferably 40 to 65/20 to 45/5 to 30, in terms of ratio by weight.

The organic amine of component (B) in the anti-reflective coating composition of the present invention is a component essential for adjusting the pH of the coating composition to the optimum range and for forming a uniform coating on various resists or substrates. The organic amine is not particularly limited insofar as it is an organic amine compound used conventionally and known in the art. Examples of the organic amines include monomethylamine, dimethylamine, trimethylamine, monoethylamine, diethylamine, triethylamine, n-propylamine, iso-propylamine, n-butylamine, tert-butylamine, di (n-butyl) amine, ethylenediamine, diethylenediamine, tetraethylenetriamine, cyclohexylamine, monoethanolamine, diethanolamine, triethanolamine, propanolamine etc. Further, the organic amine includes organic ammonium compounds such as tetramethyl ammonium hydroxide, tetraethyl ammonium hydroxide etc. As a matter of course, the present invention is not limited by these examples.

From the viewpoint of solving PED, maintenance of low refractive index, compatibility with other components in the composition, and stability with time of the coating etc, the preferable organic amine is alkanolamines such as monoethanolamine, diethanolamine, triethanolamine, propanolamine etc. among which monoethanolamine is more preferable.

Adjustment of the anti-reflective coating composition to the range of pH 1.3–3.3 with the organic amine was found to be preferable to solve PED, to exhibit coating suitability onto resist surfaces of various shapes or resists, and to attain the stability with time of the resulting coating. If the pH of the anti-reflective coating composition is not within said pH range, it becomes difficult to achieve at least one of these characteristics.

Then, the water-soluble polymer of the component (C) in the anti-reflective coating composition of the present invention is a component which forms a coating stable with time on the resist film after said composition is uniformly coated onto the surface of the resist film. The water-soluble polymer may be any one used conventionally and known in the art insofar as it is a polymer having a water solubility of 0.1% by weight or more. Examples of such water-soluble polymers include homopolymers or copolymers containing, as constitutional monomer units, hydrophilic units such as. vinyl alcohol, (meth)acrylic acid, 2-hydroxyethyl (meth) acrylate, 4-hydroxybutyl (meth)acrylate, glycosiloxyethyl (meth) acrylate, vinyl methyl ether vinyl pyrrolidone, ethylene glycol, glucose etc., and mention may further be made of water-soluble fluorine-containing polymers used for anti-reflective coating agents disclosed in Japanese Patent Application Laid-open specification Nos.110199/94, 234514/95, 50129/97, 90615/97, and 17623/98 etc. As a matter of course, the present invention is not limited by these examples.

The water-soluble polymer of component (C) may be produced in any process, and the process for producing said polymer is not particularly limited. Introduction of the hydrophilic unit into the water-soluble polymer may be effected by any polymerization method such as bulk polymerization, emulsion polymerization, suspension polymerization or solution polymerization of the hydrophilic unit itself according to polymerization mechanism such as radical polymerization, anionic polymerization, and cationic polymerization, or alternatively by a method of producing a hydrophilic unit-free polymer and then substituting it with the hydrophilic unit, or these methods may be combined.

The water-soluble polymer is preferably poly (vinyl pyrrolidone) and/or poly (acrylic acid) from the viewpoint of coating suitability for resist surfaces of different shapes or resists, stability with time of the coating, dimensional stability of the resist, low refractive index, and solubility in water after baking treatment at a high temperature of 150 to 160 ° C.

The weight average molecular weight of the water-soluble polymer is preferably 1,000 to 10,000, more preferably 2,000 to 5,000. If the molecular weight is less than 1,000, it becomes difficult to obtain a uniform coating, and simultaneously the stability with time of the coating is decreased, while if the molecular weight is more than 10,000, the threading occurs at the time of coating, and the spreading of the coating on the resist surface is poor, so a uniform coating cannot be formed by using a small amount of the composition.

In the anti-reflective coating composition, the perfluoroalkyl sulfonamide of component (D) represented by the general formula $C_nF_{2n+1}SO_2NH_2$ wherein n is an integer of 1 to 8 is the most characteristic component in the present invention. The usage of this compound in the composition leads to drastic improvements in coating suitability for resist surfaces of different shapes or resists, specifically in uniform coating properties when the composition is applied in a small amount of drip, as well as in coating suitability for stepped substrates.

The perfluoroalkyl sulfonamide represented by the above general formula is a compound having a solubility as very low as 0.05% or less in water. The solubility of said compound in the anti-reflective coating composition is increased to about 1.5% by adjusting the pH of the composition containing the above perfluoroalkylsulfonic acid etc. in the range of pH 1.3 to 3.3, so an uniform coating solution can be prepared when added. Then, when the perfluoroalkyl sulfonamide of component (D) is added to the anti-reflective coating composition with the pH adjusted in the range of 1.3 to 3.3, the dynamic surface tension and static surface tension of said composition are decreased, and simultaneously the wetting properties of the coating solution toward the surfaces of various resists are improved. As the result, coating suitability for stepped substrates is drastically improved to make formation of a coating which is uniform and stable with time possible even if the composition is applied in a small amount of drip. Further, after lithographically processed, the coating can be easily removed by known and conventional aqueous development.

In order to decrease the dynamic and static surface tensions of the anti-reflective coating composition and efficiently improve wetting properties on resist surfaces by use of the perfluoroalkyl sulfonamide, it is necessary to use one wherein n in the Rf chain is 1 to 8, among which $C_6F_{13}SO_2NH_2$, $C_7F_{15}SO_2NH_2$ or $C_8F_{17}SO_2NH_2$ (n is 6, 7 or 8) are preferable, and $C_6F_{13}SO_2NH_2$ is particularly preferable. Perfluoroaklyl sulfonamides may be used alone or in combination.

Water of component (E) in the anti-reflective coating composition of the present invention is not particularly limited insofar as it is water, but it is preferable to use water from which organic impurities, metal ions etc. were removed by distillation, ion-exchange treatment, filtration, and various adsorption treatments.

For the purpose of improving coating properties, a water-soluble organic solvent can also be used with water. The water-soluble organic solvent is not particularly limited insofar as it is dissolved in an amount of 0.1% by weight or more. Examples of the organic solvents include alcohols such as methyl alcohol, ethyl alcohol, isopropyl alcohol etc.; ketones such as acetone, methyl ethyl ketone etc.; esters such as methyl acetate, ethyl acetate etc.; and polar solvents such as dimethylformamide, dimethyl sulfoxide, methyl Cellosolve, Cellosolve, butyl Cellosolve, Cellosolve acetate, butyl carbitol, carbitol acetate etc. These examples are described as mere examples of organic solvents, and the organic solvent used in the present invention is not limited to these solvents.

As described above, the respective components (A), (B), (C), (D) and (E) are simultaneously incorporated into the anti-reflective coating composition, whereby the anti-reflective coating composition being capable of uniform coating in a small amount of drip onto a wide variety of substrates and being superior in anti-reflective effect can be obtained and the superior dimensional stability of the resist can be realized. That is, the respective components (A) to (E) are incorporated as essential ingredients in the present invention, whereby the problem of the present invention is solved not only by the effect of each component but also by the synergistic effect of the respective components.

The compounding ratio of components (A), (B), (C) and (D) in the present invention is not particularly limited insofar as the pH of the anti-reflective coating composition is regulated within the range of 1.3 to 3.3, and their compounding ratio though being different depending on the objective resist materials, exposure apparatus, anti-reflective performance, surface shape of substrate etc., is preferably perfluoroalkylsulfonic acid (A)/organic amine (B)/ perfluoroalkyl sulfonamide (D)=2.0 to 7.0/0.1 to 1.0/0.01 to 2.0 in terms of ratio by weight assuming that water-soluble polymer (C) is. 1, and more preferably (A)/(B)/(D)=3.0 to 5.0/0.15 to 0.5/0.12 to 1.3 (ratio by weight) assuming that (C) is 1.

The resist materials on which the anti-reflective coating composition of the present invention is applied, may be any ones known in the art and are not particularly limited. Examples of the resist materials include a positive-working photoresist based on a novolak resin soluble in an aqueous alkaline solution and on a naphthoquinone diazide derivative; a chemically amplified positive-working resist composed of polyhydroxystyrene partially substituted by a protective group to prevent the dissolution in an alkaline developer and be released in the presence of an acid, an photo acid generator generating an acid upon exposure to light etc.; a negative-working resist incorporating a binder polymer such as novolak resin and a photo-crosslinking agent such as bis-azide; a chemically amplified negative-working resist comprising an alkali-soluble resin such as poly(hydroxystyrene) or novolak resin as a binder polymer, a crosslinking agent such as a melamine derivative for crosslinking in the presence of an acid, and a triazine type photo acid generator generating an acid upon exposure to light, etc.

The method of forming a resist pattern by using said anti-reflective coating composition in a lithographic step upon manufacturing semiconductors is described by reference to the following example.

First, a photoresist is applied at a predetermined thickness onto a semiconductor substrate by spin-coating. The steps thereafter shall be selected by the user depending on some conditions, but followed in general by a resist bake step on a hot plate. Depending on the resist used, or depending on the arrangement of the applicator, the resist bake step may be eliminated. Subsequently, the anti-reflective coating composition is applied at a predetermined thickness by spin-coating in the same manner as in applying the photoresist. In this step, if a water-soluble coating material is to be applied by spin-coating onto the resist film which is highly hydrophobic, the phenomenon of repelling or radial coating unevenness may occur on the resist surface in general, or when a stepped pattern is formed on the substrate, coating unevenness in the form of a streak may be generated from the end of the pattern. However, when the anti-reflective coating composition of the present invention is used, generation of such coating defects can be prevented.

Thereafter, there is the step of baking the resist and the anti-reflective coating layer on said resist, but this step may also be eliminated depending on conditions. If baking is conducted after forming the anti-reflective coating layer, it is conducted generally at a temperature not higher than the temperature for baking the resist alone.

Subsequently, said photoresist and anti-reflective coating film is irradiated with light through a mask in a predetermined pattern in an exposure apparatus. As the exposure apparatus, those with g-line, i-line or excimer laser light source can be used, but the exposure apparatus is not limited to the above.

Following this exposure step, baking treatment on a hot plate is generally conducted for improvement of the resist pattern shape or for progress of the reaction when the chemically amplified resist is used. As a matter of course, this baking treatment may also be eliminated depending on the resist composition used. In particular, the chemically amplified resist may be influenced by an alkaline component in the atmosphere in which it is left after exposure to light, thus causing deterioration of the resist pattern shape after development in some cases. The influence of its being left (PED) can be prevented by said anti-reflective coating formed on the resist.

The resist and anti-reflective coating layers after subjected to exposure treatment are developed during a development step using an aqueous alkaline solution (using 2.38% aqueous tetramethyl ammonium hydroxide in many cases) to form a resist pattern.

As a matter of course, the present invention is not limited by the above specific description.

The anti-reflective coating composition of the present invention can be applied in a small amount of drip onto any type of resists such as all-purpose resist, chemically amplified resist etc., and the coating thus formed can effectively inhibit the multiple reflection effect and PED, and realize the superior dimensional stability of the resist.

Hereinafter, the present invention is described in detail by reference to the Examples and Comparative Examples, which however are not intended to limit the present invention. The term "parts" refers M to parts by weight unless otherwise specified.

EXAMPLE 1

1.0 part of poly(vinyl pyrrolidone) with a weight average molecular weight of 3,000, 4.0 parts of $C_8F_{17}SO_3H$, 0.35 part of monoethanolamine, and 0.1 part of $C_6F_{13}SO_2NH_2$ were uniformly dissolved in 94.55 parts of pure water by heating them to 70 °C. The solution was returned to room temperature (23° C.) and confirmed to be uniform. The solution obtained was then passed through a 0.05 μm filter to prepare an anti-reflective coating composition. The pH value of this anti-reflective coating composition at 23° C. was 1.63. Table 1 shows the static and dynamic surface tensions of the resulting anti-reflective coating composition and the contact angle when said composition was dropped on the surface of a resist.

Static surface tension, dynamic surface tension and contact angle were determined by the following measurement methods.

Static Surface Tension:

Determined at 23° C. with an automatic equilibrium-type electronic surface tension balance ESB-IV model (Kyowa Kagaku K. K.) by the Wilhelmy method by use of a platinum plate.

Dynamic Surface Tension:

Determined by evaluating the hysteresis of the surface tension formed when its solution area was changed successively 10 times from 20 to 80 cm$^2$ at a rate of 10 sec./cycle at 23 °C. by use of an automatic dynamic surface tension balance DST-A1 model (Kyowa Kaimen Kagaku K. K.). Specifically, the hysteresis formed by the 10th change was adopted as surface loss energy ($10^{-5}$ mJ).

Contact Angle:

The value of contact angle just (about 2 to 3 seconds) after the anti-reflective coating composition was dropped onto the surface of a resist, as determined at 23° C. by an automatic contact angle meter CA-Z model (Kyowa Kaimen Kagaku K. K.), was adopted.

EXAMPLES 2 TO 15

Example 1 was repeated using the compounds in the amounts (parts) shown in Tables 1 and 2 to give the anti-reflective coating compositions in Examples 2 to 15. The pH values of the resulting anti-reflective coating compositions were as shown in Tables 1 and 2.

The static surface tension, dynamic surface tension and contact angle of the anti-reflective coating composition in each example were determined in the same manner as in Example 1. The results are shown in Tables 1 and 2.

TABLE 1

|  | Example 1 | Example 2 | Example 3 | Example 4 | Example 5 | Example 6 | Example 7 | Example 8 |
|---|---|---|---|---|---|---|---|---|
| poly(vinyl pyrrolidone) (Mw = 3,000) | 1.0 | 1.0 | 0.2 | 1.0 | 1.0 | 1.0 | 1.0 | 1.0 |
| poly(acrylic acid) (Mw = 2,500) |  |  | 0.8 |  |  |  |  |  |
| $C_8F_{17}SO_3H$ | 4.0 | 4.0 | 4.0 | 1.6 | 1.8 | 1.8 | 1.6 | 1.6 |
| $C_7F_{15}SO_3H$ |  |  |  | 0.1 |  |  | 0.1 | 0.1 |
| $C_6F_{13}SO_3H$ |  |  |  | 1.2 | 1.4 | 1.8 | 1.2 | 1.2 |
| $C_5F_{11}SO_3H$ |  |  |  | 0.5 |  |  | 0.5 | 0.5 |
| $C_4F_6SO_3H$ |  |  |  | 0.2 |  | 0.5 | 0.2 | 0.2 |
| monoethanolamine | 0.35 | 0.35 | 0.35 | 0.38 | 0.38 | 0.38 | 0.45 | 0.25 |
| diethanolamine |  |  |  |  |  |  |  |  |
| dimethylethanolamine |  |  |  |  |  |  |  |  |
| $C_8F_{17}SO_2NH_2$ |  | 0.1 |  |  |  |  |  |  |
| $C_6F_{13}SO_2NH_2$ | 0.1 |  | 0.1 | 0.7 | 1.2 | 0.4 | 0.7 | 0.7 |
| $C_8F_{17}SO_2N(C_3H_6)CH_2CH_2OH$ |  |  |  |  |  |  |  |  |
| pure water | 94.55 | 94.55 | 94.55 | 94.32 | 93.72 | 94.62 | 94.25 | 94.45 |
| pH | 1.63 | 1.69 | 1.61 | 1.94 | 1.95 | 1.92 | 3.22 | 1.38 |
| Static surface tension (m N/m) | 23.5 | 24.8 | 21.7 | 17.4 | 15.9 | 19.6 | 17.1 | 17.7 |
| Surface loss energy ($10^{-5}$ mJ) | 66 | 205 | 55 | 51 | 57 | 63 | 40 | 66 |
| Contact angle (deg.) | 42 | 40 | 39 | 27 | 25 | 32 | 25 | 32 |

TABLE 2

|  | Example 9 | Example 10 | Example 11 | Example 12 | Example 13 | Example 14 | Example 15 |
|---|---|---|---|---|---|---|---|
| poly(vinyl pyrrolidone) (Mw = 3,000) | 1.0 | 1.0 | 1.0 | 1.0 | 1.0 | 1.0 | 1.0 |
| poly(acrylic acid) (Mw = 2,500) |  |  |  |  |  |  |  |
| $C_8F_{17}SO_3H$ | 0.93 | 3.0 | 3.0 | 0.8 | 1.6 | 1.6 | 1.6 |
| $C_7F_{15}SO_3H$ | 0.06 | 0.2 | 0.2 | 0.05 | 0.1 | 0.1 | 0.1 |
| $C_6F_{13}SO_3H$ | 0.7 | 2.3 | 2.3 | 0.6 | 1.2 | 1.2 | 1.2 |
| $C_5F_{11}SO_3H$ | 0.29 | 0.9 | 0.9 | 0.25 | 0.5 | 0.5 | 0.5 |
| $C_4F_9SO_3H$ | 0.12 | 0.4 | 0.4 | 0.1 | 0.2 | 0.2 | 0.2 |
| monoethanolamine | 0.23 | 0.74 | 0.87 | 0.2 | 0.39 |  |  |
| diethanolamine |  |  |  |  |  | 0.67 |  |
| dimethylethanolamine |  |  |  |  |  |  | 0.57 |
| $C_8F_{17}SO_2NH_2$ |  |  |  |  |  |  |  |
| $C_6F_{13}SO_2NH_2$ | 0.7 | 0.7 | 0.7 | 0.7 | 0.3 | 0.7 | 0.7 |
| $C_4F_9SO_2NH_2$ |  |  |  |  | 0.4 |  |  |
| $C_8F_{17}SO_2N(C_3H_6)CH_2CH_2OH$ |  |  |  |  |  |  |  |

TABLE 2-continued

|  | Example 9 | Example 10 | Example 11 | Example 12 | Example 13 | Example 14 | Example 15 |
|---|---|---|---|---|---|---|---|
| pure water | 95.97 | 90.76 | 90.63 | 96.30 | 94.31 | 94.03 | 94.13 |
| pH | 1.91 | 1.97 | 3.25 | 1.93 | 1.89 | 1.91 | 1.92 |
| Static surface tension (m N/m) | 17.5 | 17.5 | 16.8 | 17.4 | 18.0 | 17.6 | 17.5 |
| Surface loss energy ($10^{-5}$ mJ) | 56 | 59 | 45 | 55 | 64 | 59 | 58 |
| Contact angle (deg.) | 38 | 46 | 23 | 30 | 34 | 28 | 30 |

COMPARATIVE EXAMPLES 1 TO 7

Example 1 was repeated using the compounds in the amounts (parts) shown in Table 3 to give the anti-reflective coating compositions in Comparative Examples 1 to 7. The pH values of the resulting anti-reflective coating compositions were as shown in Table 3.

The static surface tension, dynamic surface tension and contact angle of the anti-reflective coating composition in each comparative example were measured in the same manner as in Example 1. The results are shown in Table 3.

Separately, the resist AZ® DX1100 was applied onto a 6-inch substrate with a step of a 5000 angstrom-height silicon oxide layer, and then baked in the same manner as in the above-described experiment. Onto this substrate was dropped and applied an anti-reflective it; composition sample by use of the resist coater LARC-ULTIMA 1000 (Lithoteck Ltd.), and the coating after spin-coated was observed for its state under a microscope.

Evaluation of Coating Stability:

The coating formed in the evaluation of coating properties was kept in a clean room and observed for its state with time.

TABLE 3

| Comparative Example | 1 | 2 | 3 | 4 | 5 | 6 | 7 |
|---|---|---|---|---|---|---|---|
| poly(vinyl pyrrolidone) (Mw = 3,000) | 1.0 | 1.0 | 1.0 | 1.0 | 1.0 | 1.0 |  |
| poly(acrylic acid) (Mw = 2,500) |  |  |  |  |  |  | 1.0 |
| $C_8F_{17}SO_3H$ | 3.2 | 1.6 | 1.6 | 1.6 | 1.6 | 4.0 | 4.0 |
| $C_7F_{15}SO_3H$ | 0.2 | 0.1 | 0.1 | 0.1 | 0.1 |  |  |
| $C_6F_{13}SO_3H$ | 2.4 | 1.2 | 1.2 | 1.2 | 1.2 |  |  |
| $C_5F_{11}SO_3H$ | 1.0 | 0.5 | 0.5 | 0.5 | 0.5 |  |  |
| $C_4F_9SO_3H$ | 0.4 | 0.2 | 0.2 | 0.2 | 0.2 |  |  |
| monoethanolamine | 0.78 | 0.28 | 0.28 | 0.5 | 0.2 | 0.35 | 0.35 |
| diethanolamine |  |  |  |  |  |  |  |
| dimethylethanolanine |  |  |  |  |  |  |  |
| $C_8F_{17}SO_2NH_2$ |  |  |  |  |  |  |  |
| $C_8F_{13}SO_2NH_2$ | 0.7 |  |  | 0.7 | 0.7 |  |  |
| $C_8F_{17}SO_2N(C_3H_6)CH_2CH_2OH$ |  | 0.7 |  |  |  |  |  |
| pure water | 90.32 | 94.42 | 95.12 | 94.20 | 94.50 | 94.65 | 94.65 |
| pH | 1.97 | 1.76 | 1.77 | 3.45 | 1.21 | 1.73 | 1.76 |
| Static surface tension (m N/m) | 17.4 | 17.8 | 26.0 | 16.8 | 17.7 | 27.2 | 27.4 |
| Surface loss energy ($10^{-5}$ mJ) | 57 | 2000 | 57 | 54 | 70 | 55 | 120 |
| Ccntact angle (deg.) | 29 | 41 | 49 | 20 | 38 | 50 | 53 |

EXAMPLE 16

According to the evaluation methods described below, coating properties, coating stability, refractive index and lithographic characteristics of the anti-reflective coating compositions obtained in Examples 1 to 15 above were evaluated. The results are shown in Tables 4 and 5. The refractive index in the tables is a value at 248 nm.

Evaluation of Coating Properties:

A chemically amplified positive-working resist, AZ® DX1100 (Clariant (Japan) K.K.), was applied at a thickness of 0.75 $\mu$m after baked onto an 8-inch silicon wafer treated with HMDS, and subjected to baking treatment at 110° C. for 60 seconds on a hot plate to prepare a substrate for evaluation. Then, an anti-reflective coating composition sample was dropped and applied onto the above substrate by means of a resist coater LARC-ULTIMA 1000 (Lithoteck Ltd.), and the minimum amount of the dropped composition necessary for forming a uniform coating on the 8-inch wafer was comparatively evaluated.

Evaluation of coating stability was conducted according to the following criteria.

A: No problem.

B: Fine needle crystals are observed but there is no problem for use.

C: Precipitation of fine crystals is observed but there is no problem for use.

D: Not usable with crystals precipitated.

Evaluation of Refractive Index:

An anti-reflective coating composition sample was applied at a thickness of 450 angstroms after baked onto a 6-inch silicon wafer by means of the resist coater LARC-ULTIMA 1000 (Lithoteck Ltd.), and then subjected to baking treatment at 90° C. for 60 seconds on a hot plate, and its refractive index was determined between 193 nm and 930 nm by means of Spectral Eripsometer ES5G (Sopra Ltd.).

Evaluation of Lithographic Characteristics:

A chemically amplified positive resist, AZ® DX1100 (Clariant (Japan) K.K.), was applied at a thickness of 0.75 pm after baked onto a 6-inch silicon wafer treated with HMDS, and subjected to baking treatment at 110° C. for 60 seconds on a hot plate, and an anti-reflective coating composition sample was then applied onto it at an approximately predetermined film thickness after baking on the basis of formulae 1 and 2 above, and then it was subjected to baking treatment at 90° C. for 60 seconds on a hot plate and then exposed to light with KrF excimer laser stepper NSR-2005 EX10B (an exposure apparatus from Nikon K.K., NA: 0.55, σ: 0.55) and subjected to PEB (post exposure bake) at 70° C. for 90 seconds on a hot plate, followed by paddle development for 60 seconds by use of an organic alkali developer AZ®300 MIF (developer solution produced by Clariant (Japan) K.K.). After development, the sectional shape of the pattern was observed under a scanning electron microscope S-4000 (K.K. Hitachi Seisakusho) ("resist pattern profile" in the table).

Separately, the above exposed wafer was allow to stand for 12 hours till PEB after exposure, and then developed in the same manner, and the stabilization effect on PED (post exposure delay) was evaluated in the same manner ("shape deterioration by PED" in the table).

Evaluation of resist pattern profile and shape deterioration by PED was made according to the following criteria:

A: No problem.

B: Dark erosion (DE) tends to be increased, but there is no problem for use.

C: Resist pattern profile tends to be T-shaped, but there is no problem for use.

D: Dark erosion (DE) is too large.

E: Resist pattern profile is T-shaped and not usable.

TABLE 4

|  | Example 1 | Example 2 | Example 3 | Example 4 | Example 5 | Example 6 | Example 7 | Example 8 |
|---|---|---|---|---|---|---|---|---|
| Coating properties |  |  |  |  |  |  |  |  |
| The minimum amount of the composition dropped on the 8-inch wafer | 3.5 ml | 4.0 ml | 3.5 ml | 2.5 ml | 2.5 ml | 3 ml | 2.5 ml | 2.5 ml |
| Coating properties on the stepped substrate | OK | OK | OK | OK | OK | OK | OK | OK |
| Coating stability | B | B | B | A | A | B | A | A |
| Refractive index (248 nm) | 1.42 | 1.42 | 1.42 | 1.42 | 1.43 | 1.43 | 1.44 | 1.43 |
| Lithographic characteristics |  |  |  |  |  |  |  |  |
| Resist pattern profile | B | B | B | A | A | A | C | B |
| Shape deterioration by PED | B | B | B | A | A | A | C | B |

TABLE 5

|  | Example 9 | Example 10 | Example 11 | Example 12 | Example 13 | Example 14 | Example 15 |
|---|---|---|---|---|---|---|---|
| Coating properties |  |  |  |  |  |  |  |
| The minimum amount of the composition dropped on the 8-inch wafer | 2.5 ml | 3.5 ml | 3.5 ml | 2.5 ml | 3.0 ml | 2.5 ml | 2.5 ml |
| Coating properties on the stepped substrate | OK | OK | OK | OK | OK | slight streation | slight streation |
| Coating stability | A | C | C | A | A | A | A |
| Refractive index (248 nm) | 1.46 | 1.41 | 1.44 | 1.47 | 1.42 | 1.43 | 1.42 |
| Lithographic characteristics |  |  |  |  |  |  |  |
| Resist pattern profile | A | A | C | A | A | A | A |
| Shape deterioration by PED | A | A | C | A | A | A | A |

COMPARATIVE EXAMPLE 8

Coating properties, coating stability, refractive index and lithographic characteristics of the anti-reflective coating compositions obtained in Comparative Examples 1 to 7 were evaluated in the same manner as in Example 16. The results are shown in Table 6.

TABLE 6

| Comparative Example | 1 | 2 | 3 | 4 | 5 | 6 | 7 |
|---|---|---|---|---|---|---|---|
| Coating properties | | | | | | | |
| The minimum amount of the composition dropped on the 8-inch wafer | 3.5 ml | 8 ml | 8 ml | 3.0 ml | 3.0 ml | 7 ml | 8 ml |
| Coating properties on the stepped substrate | OK | streation | streation | OK | OK | streation | streation |
| Coating stability | D | A | A | D | A | D | B |
| Refractive index (248 nm) | 1.42 | 1.44 | 1.43 | 1.44 | 1.41 | 1.45 | 1.45 |
| Lithographic characteristics | | | | | | | |
| Resist pattern profile | A | D | D | E | D | D | D |
| Shape deterioration by PED | A | D | D | E | D | D | D |

From Tables 4, 5 and 6, the anti-reflective compositions in Comparative Examples have problems with at least one of coating properties, coating stability, refractive index, and lithographic characteristics, whereas those of the present invention are superior in any of the characteristics including coating properties, coating stability, refractive index, and lithographic characteristics, and it is understood that the present invention can provide a composition with no problem for use.

EFFECTS OF INVENTION

The anti-reflective coating composition of the present invention can be applied uniformly in a small amount of drip onto any type of resists, for example all-purpose resist, chemically amplified resist etc regardless of the surface shape of a substrate as the object oIE application. The coating thus formed can effectively inhibit the multiple reflection effect, standing wave effect and PED, whereby a resist pattern excellent in dimensional stability and in sectional shape can be formed.

What is claimed is:

1. An anti-reflective coating composition comprising an admixture of at least the following (A), (B), (C), (D) and (E) and having a pH value of 1.3 to 3.3, (A) perfluoroalkylsulfonic acid represented by the general formula:

$$C_nF_{2n+1}SO_3H \tag{I}$$

wherein n is an integer of 4 to 8, (B) organic amine, (C) water-soluble polymer, (D) perfluoroalkyl sulfonamide represented by the general formula:

$$C_nF_{2n+1}SO_2NH_2 \tag{II}$$

wherein n is an integer of 1 to 8, and (E) water.

2. An anti-reflective coating composition according to claim 1, wherein the organic amine is an alkanolamine.

3. An anti-reflective coating composition according to claim 1, wherein the water-soluble polymer is poly(vinyl pyrrolidone) and/or poly(acrylic acid).

4. An anti-reflective coating composition according to claim 1, wherein the ratio by weight of perfluoroalkylsulfonic acid (A), organic amine (B), water-soluble polymer (C), and perfluoroalkyl sulfonamide (D) in the composition is set such that (A)/(B)/(D)=2.0 to 7.0/0.1 to 1.0/0.01 to 2.0 assuming that the ratio of water-soluble polymer (C) is 1.

5. A method of forming a pattern, which comprises the steps of;

a) forming a coating of photoresist on a substrate;

b) optionally, baking the substrate to substantially dry the photoresist coating;

c) coating the anti-reflective coating composition according to claim 1 on top of the photoresist coating; and, d) optionally, baking the substrate to substantially dry the anti-reflective coating; and, e) imagewise exposing and developing the photoresist.

* * * * *